(12) United States Patent
Lee et al.

(10) Patent No.: US 8,603,319 B2
(45) Date of Patent: Dec. 10, 2013

(54) METHODS AND SYSTEMS FOR REMOVING MATERIALS FROM MICROFEATURE WORKPIECES WITH ORGANIC AND/OR NON-AQUEOUS ELECTROLYTIC MEDIA

(71) Applicant: Micron Technology, Inc., Boise, ID (US)

(72) Inventors: Whonchee Lee, Boise, ID (US); Gundu M. Sabde, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/711,432

(22) Filed: Dec. 11, 2012

(65) Prior Publication Data

US 2013/0102154 A1    Apr. 25, 2013

Related U.S. Application Data

(63) Continuation of application No. 12/488,062, filed on Jun. 19, 2009, now abandoned, which is a continuation-in-part of application No. 10/933,053, filed on Sep. 1, 2004, now Pat. No. 7,566,391.

(51) Int. Cl.
    *C25F 3/16*    (2006.01)

(52) U.S. Cl.
    USPC ............................ 205/677; 205/674; 438/751

(58) Field of Classification Search
    USPC ................................... 205/674, 677; 438/751
    See application file for complete search history.

(56) References Cited

U.S. PATENT DOCUMENTS

| | | |
|---|---|---|
| 2,315,695 A | 4/1943 | Faust |
| 2,516,105 A | 7/1950 | der Mateosian |
| 3,239,439 A | 3/1966 | Helmke |
| 3,334,210 A | 8/1967 | Williams et al. |
| 4,613,417 A | 9/1986 | Laskowski et al. |
| 4,839,005 A | 6/1989 | Katsumoto et al. |
| 5,098,533 A | 3/1992 | Duke et al. |

(Continued)

FOREIGN PATENT DOCUMENTS

| | | |
|---|---|---|
| EP | 0459397 A2 | 12/1991 |
| EP | 1 123 956 A1 | 8/2001 |

(Continued)

OTHER PUBLICATIONS

Aboaf, J.A. and R.W. Broadie, IBM Technical Disclosure Bulletin, Rounding of Square-Shape Holes in Silicon Wafers, vol. 19, No. 8, p. 3042, Jan. 1977, XP-002235690, NN 77013042.

(Continued)

*Primary Examiner* — Nicholas A Smith
(74) *Attorney, Agent, or Firm* — Perkins Coie LLP

(57) ABSTRACT

Methods and systems for removing materials from microfeature workpieces are disclosed. A method in accordance with one embodiment of the invention includes providing a microfeature workpiece having a substrate material and a conductive material that includes a refractory metal (e.g., tantalum, tantalum nitride, titanium, and/or titanium nitride). First and second electrodes are positioned in electrical communication with the conductive material via a generally organic and/or non-aqueous electrolytic medium. At least one of the electrodes is spaced apart from the workpiece. At least a portion of the conductive material is removed by passing an electrical current along an electrical path that includes the first electrode, the electrolytic medium, and the second electrode. Electrolytically removing the conductive material can reduce the downforce applied to the workpiece.

20 Claims, 8 Drawing Sheets

(56) References Cited

U.S. PATENT DOCUMENTS

| | | |
|---|---|---|
| 5,162,248 A | 11/1992 | Dennison et al. |
| 5,244,534 A | 9/1993 | Yu et al. |
| 5,300,155 A | 4/1994 | Sandhu et al. |
| 5,344,539 A | 9/1994 | Shinogi et al. |
| 5,562,529 A | 10/1996 | Kishii et al. |
| 5,567,300 A | 10/1996 | Datta et al. |
| 5,575,885 A | 11/1996 | Hirabayashi et al. |
| 5,618,381 A | 4/1997 | Doan et al. |
| 5,624,300 A | 4/1997 | Kishii et al. |
| 5,676,587 A | 10/1997 | Landers et al. |
| 5,681,423 A | 10/1997 | Sandhu et al. |
| 5,780,358 A | 7/1998 | Zhou et al. |
| 5,800,248 A | 9/1998 | Pant et al. |
| 5,807,165 A | 9/1998 | Uzoh et al. |
| 5,840,629 A | 11/1998 | Carpio |
| 5,843,818 A | 12/1998 | Joo et al. |
| 5,846,398 A | 12/1998 | Carpio |
| 5,863,307 A | 1/1999 | Zhou et al. |
| 5,888,866 A | 3/1999 | Chien |
| 5,897,375 A | 4/1999 | Watts et al. |
| 5,911,619 A | 6/1999 | Uzoh et al. |
| 5,930,699 A | 7/1999 | Bhatia |
| 5,934,980 A | 8/1999 | Koos et al. |
| 5,952,687 A | 9/1999 | Kawakubo et al. |
| 5,954,975 A | 9/1999 | Cadien et al. |
| 5,954,997 A | 9/1999 | Kaufman et al. |
| 5,972,792 A | 10/1999 | Hudson |
| 5,993,637 A | 11/1999 | Hisamatsu et al. |
| 6,001,730 A | 12/1999 | Farkas et al. |
| 6,007,695 A | 12/1999 | Knall et al. |
| 6,010,964 A | 1/2000 | Glass |
| 6,024,856 A | 2/2000 | Haydu et al. |
| 6,033,953 A | 3/2000 | Aoki et al. |
| 6,039,633 A | 3/2000 | Chopra |
| 6,046,099 A | 4/2000 | Cadien et al. |
| 6,051,496 A | 4/2000 | Jang |
| 6,060,386 A | 5/2000 | Givens |
| 6,060,395 A | 5/2000 | Skrovan et al. |
| 6,063,306 A | 5/2000 | Kaufman et al. |
| 6,066,030 A | 5/2000 | Uzoh |
| 6,066,559 A | 5/2000 | Gonzalez et al. |
| 6,068,787 A | 5/2000 | Grumbine et al. |
| 6,077,412 A | 6/2000 | Ting et al. |
| 6,083,840 A | 7/2000 | Mravic et al. |
| 6,100,197 A | 8/2000 | Hasegawa |
| 6,103,096 A | 8/2000 | Datta et al. |
| 6,103,628 A | 8/2000 | Talieh |
| 6,103,636 A | 8/2000 | Zahorik et al. |
| 6,115,233 A | 9/2000 | Seliskar et al. |
| 6,117,781 A | 9/2000 | Lukanc et al. |
| 6,121,152 A | 9/2000 | Adams et al. |
| 6,132,586 A | 10/2000 | Adams et al. |
| 6,143,155 A | 11/2000 | Adams et al. |
| 6,162,681 A | 12/2000 | Wu |
| 6,171,467 B1 | 1/2001 | Weihs et al. |
| 6,174,425 B1 | 1/2001 | Simpson et al. |
| 6,176,992 B1 | 1/2001 | Talieh |
| 6,180,947 B1 | 1/2001 | Stickel et al. |
| 6,187,651 B1 | 2/2001 | Oh |
| 6,190,494 B1 | 2/2001 | Dow |
| 6,196,899 B1 | 3/2001 | Chopra et al. |
| 6,197,182 B1 | 3/2001 | Kaufman et al. |
| 6,206,756 B1 | 3/2001 | Chopra et al. |
| 6,218,309 B1 | 4/2001 | Miller et al. |
| 6,250,994 B1 | 6/2001 | Chopra et al. |
| 6,259,128 B1 | 7/2001 | Adler et al. |
| 6,273,786 B1 | 8/2001 | Chopra et al. |
| 6,276,996 B1 | 8/2001 | Chopra |
| 6,280,581 B1 | 8/2001 | Cheng |
| 6,287,974 B1 | 9/2001 | Miller |
| 6,299,741 B1 | 10/2001 | Sun et al. |
| 6,303,956 B1 | 10/2001 | Sandhu et al. |
| 6,313,038 B1 | 11/2001 | Chopra et al. |
| 6,322,422 B1 | 11/2001 | Satou |
| 6,328,632 B1 | 12/2001 | Chopra |
| 6,368,184 B1 | 4/2002 | Beckage |
| 6,368,190 B1 | 4/2002 | Easter et al. |
| 6,379,223 B1 | 4/2002 | Sun et al. |
| 6,395,152 B1 | 5/2002 | Wang |
| 6,395,607 B1 | 5/2002 | Chung |
| 6,416,647 B1 | 7/2002 | Dordi et al. |
| 6,455,370 B1 | 9/2002 | Lane |
| 6,461,911 B2 | 10/2002 | Ahn et al. |
| 6,464,855 B1 | 10/2002 | Chadda et al. |
| 6,504,247 B2 | 1/2003 | Chung |
| 6,515,493 B1 | 2/2003 | Adams et al. |
| 6,537,144 B1 | 3/2003 | Tsai et al. |
| 6,551,935 B1 | 4/2003 | Sinha et al. |
| 6,599,806 B2 | 7/2003 | Lee |
| 6,603,117 B2 | 8/2003 | Corrado et al. |
| 6,605,539 B2 | 8/2003 | Lee et al. |
| 6,607,988 B2 | 8/2003 | Yunogami et al. |
| 6,620,037 B2 | 9/2003 | Kaufman et al. |
| 6,632,335 B2 | 10/2003 | Kunisawa et al. |
| 6,653,226 B1 * | 11/2003 | Reid ............................ 438/631 |
| 6,689,258 B1 | 2/2004 | Lansford et al. |
| 6,693,036 B1 | 2/2004 | Nogami et al. |
| 6,705,926 B2 | 3/2004 | Zhou et al. |
| 6,722,942 B1 | 4/2004 | Lansford et al. |
| 6,722,950 B1 | 4/2004 | Dabral et al. |
| 6,726,823 B1 | 4/2004 | Wang et al. |
| 6,736,952 B2 | 5/2004 | Emesh et al. |
| 6,753,250 B1 | 6/2004 | Hill et al. |
| 6,776,693 B2 | 8/2004 | Duboust et al. |
| 6,780,772 B2 | 8/2004 | Uzoh et al. |
| 6,797,623 B2 | 9/2004 | Sato et al. |
| 6,808,617 B2 | 10/2004 | Sato et al. |
| 6,811,680 B2 | 11/2004 | Chen et al. |
| 6,846,227 B2 | 1/2005 | Sato et al. |
| 6,848,970 B2 | 2/2005 | Manens et al. |
| 6,852,630 B2 | 2/2005 | Basol et al. |
| 6,858,124 B2 | 2/2005 | Zazzera et al. |
| 6,867,136 B2 | 3/2005 | Basol et al. |
| 6,867,448 B1 | 3/2005 | Lee et al. |
| 6,881,664 B2 | 4/2005 | Catabay et al. |
| 6,884,338 B2 | 4/2005 | Kesari et al. |
| 6,893,328 B2 | 5/2005 | So |
| 6,899,804 B2 | 5/2005 | Duboust et al. |
| 6,951,599 B2 | 10/2005 | Yahalom et al. |
| 6,977,224 B2 | 12/2005 | Dubin et al. |
| 7,074,113 B1 | 7/2006 | Moore |
| 7,078,308 B2 | 7/2006 | Lee et al. |
| 7,094,131 B2 | 8/2006 | Lee et al. |
| 7,112,121 B2 | 9/2006 | Lee et al. |
| 7,112,122 B2 | 9/2006 | Lee et al. |
| 7,129,160 B2 | 10/2006 | Chopra |
| 7,153,777 B2 | 12/2006 | Lee |
| 7,192,335 B2 | 3/2007 | Lee et al. |
| 7,229,535 B2 | 6/2007 | Wang et al. |
| 2001/0035354 A1 | 11/2001 | Ashjaee et al. |
| 2002/0025759 A1 | 2/2002 | Lee et al. |
| 2002/0025760 A1 | 2/2002 | Lee et al. |
| 2002/0025763 A1 | 2/2002 | Lee et al. |
| 2002/0104764 A1 | 8/2002 | Banerjee et al. |
| 2002/0115283 A1 | 8/2002 | Ho et al. |
| 2003/0054729 A1 | 3/2003 | Lee et al. |
| 2003/0064669 A1 | 4/2003 | Basol et al. |
| 2003/0109198 A1 | 6/2003 | Lee et al. |
| 2003/0113996 A1 | 6/2003 | Nogami et al. |
| 2003/0127320 A1 | 7/2003 | Emesh et al. |
| 2003/0129927 A1 | 7/2003 | Lee et al. |
| 2003/0178320 A1 | 9/2003 | Liu et al. |
| 2003/0226764 A1 | 12/2003 | Moore et al. |
| 2003/0234184 A1 | 12/2003 | Liu et al. |
| 2004/0043582 A1 | 3/2004 | Chopra |
| 2004/0043629 A1 | 3/2004 | Lee et al. |
| 2004/0043705 A1 | 3/2004 | Lee et al. |
| 2004/0154931 A1 | 8/2004 | Hongo et al. |
| 2004/0192052 A1 | 9/2004 | Mukherjee et al. |
| 2004/0259479 A1 | 12/2004 | Sevilla |
| 2005/0016861 A1 | 1/2005 | Laursen et al. |
| 2005/0020004 A1 | 1/2005 | Chopra |
| 2005/0020192 A1 | 1/2005 | Lee et al. |
| 2005/0034999 A1 | 2/2005 | Moore et al. |

(56) References Cited

U.S. PATENT DOCUMENTS

| | | |
|---|---|---|
| 2005/0035000 A1 | 2/2005 | Moore et al. |
| 2005/0056550 A1 | 3/2005 | Lee et al. |
| 2005/0059324 A1 | 3/2005 | Lee et al. |
| 2005/0133379 A1 | 6/2005 | Basol et al. |
| 2005/0173260 A1 | 8/2005 | Basol et al. |
| 2005/0178743 A1 | 8/2005 | Manens et al. |
| 2005/0196963 A1 | 9/2005 | Lee |
| 2006/0042956 A1 | 3/2006 | Lee et al. |
| 2006/0163083 A1 | 7/2006 | Andricacos et al. |
| 2006/0189139 A1 | 8/2006 | Lee |
| 2006/0191800 A1 | 8/2006 | Moore |
| 2006/0199351 A1 | 9/2006 | Lee et al. |
| 2006/0208322 A1 | 9/2006 | Lee et al. |
| 2006/0217040 A1 | 9/2006 | Moore |

FOREIGN PATENT DOCUMENTS

| | | |
|---|---|---|
| JP | 1241129 A | 9/1989 |
| JP | 06120182 A | 4/1994 |
| JP | 10335305 A | 12/1998 |
| JP | 11-145273 A | 5/1999 |
| JP | 2000-269318 A | 9/2000 |
| JP | 2001077117 A1 | 3/2001 |
| TW | 516471 | 1/2003 |
| WO | 00/26443 A2 | 5/2000 |
| WO | 00/28586 A2 | 5/2000 |
| WO | 00/32356 A1 | 6/2000 |
| WO | 00/59008 A2 | 10/2000 |
| WO | 00/59682 A1 | 10/2000 |
| WO | 02/064314 A1 | 8/2002 |
| WO | 02/085570 | 10/2002 |
| WO | 03/072672 A1 | 9/2003 |

OTHER PUBLICATIONS

ATMI, Inc., adapted from a presentation at the Semicon West '99 Low Dielectric Materials Technology Conference, San Francisco, California, Jul. 12, 1999, pp. 13-25.

Bassous, E., IBM Technical Disclosure Bulletin, Low Temperature Methods for Rounding Silicon Nozzles, vol. 20, No. 2, Jul. 1977, pp. 810-811, XP-002235692, NN 7707810.

Bernhardt, A.F., R.J. Contolini, and S.T. Mayer, "Electrochemical Planarization for Multi-Level Metallization of Microcircuitry," CircuiTree, vol. 8, No. 10, pp. 38, 40, 42, 44, 46, and 48, Oct. 1995.

D'Heurle, F.M. and K.C. Park, IBM Technical Disclosure Bulletin, Electrolytic Process for Metal Pattern Generation, vol. 17, No. 1, pp. 271-272, Jun. 1974, XP-002235691, NN 7406271.

Frankenthal, R.P. and Eaton, D.H., "Electroetching of Platinum in the Titanium-Platinum-Gold Metallization Silicon Integrated Circuits," Journal of the Electrochemical Society, vol. 123, No. 5, pp. 703-706, May 1976, Pennington, New Jersey.

Huang, C.S. et al., "A Novel UV Baking Process to Improve DUV Photoresist Hardness," pp. 135-138, Proceedings of the 1999 International Symposium, VLSI Technology, Systems, and Applications: Proceedings of Technical Papers: Jun. 8-10, 1999, Taipei, Taiwan, Institute of Electrical and Electronics Engineers, Inc., Sep. 1999.

Juchniewicz, R. et al. "Influence of Pulsed Current Plantinised Titanium and Tantalum Anode Durability," Internaitonal Congress Metallic Corrosion, Proceedings—vol. 3, pp. 449-453, Toronto, Jun. 3/7, 1984.

Kondo, S. et al., "Abrasive-Free Polishing for Copper Damascene Interconnection," Journal of the Electrochemical Society, vol. 147, No. 10, pp. 3907-3913, The Electrochemical Society, Inc., Pennington, New Jersey, 2000.

McGraw-Hill, "Chemical bonding," Concise Encyclopedia of Science & Technology, Fourth Edition, Sybil P. Parker, Editor in Chief, p. 367, McGraw-Hill, New York, New York, 1998.

Micro Photonics, Inc. CSM Application Bulletin. Low-load Micro Scratch Tester (MST) for characterization of thin polymer films [online]. 3 pages. Retrieved from the Internet Jul. 25, 2002. <http://www.microphotonics.com/mstABpoly.html>.

Micro Photonics, Inc. CSM Nano Hardness Tester [online]. 6 pages. Retrieved from the Internet, Jul. 29, 2002. <http://www.microphotonics.com/nht.html>.

PhysicsWorld. Hard Materials (excerpt of Superhard superlattices) [online]. S. Barnett and A. Madan, Physics World, Jan. 1998, Institute of Physics Publishing Ltd., Bristol, United Kingdom. Retrieved from the Internet, Jul. 29, 2002 <http://physicsweb.org/box/world/11/1/11/world-11-1-11-1>.

Wolf, S. et al. Silicon Processing for the VLSI Era, vol. 1: Process Technology, pp. 188-189, Lattice Press, 1986.

\* cited by examiner

METHODS AND SYSTEMS FOR REMOVING MATERIALS FROM MICROFEATURE WORKPIECES WITH ORGANIC AND/OR NON-AQUEOUS ELECTROLYTIC MEDIA

CROSS-REFERENCE TO RELATED APPLICATIONS

This application is a continuation of U.S. application Ser. No. 12/488,062 filed Jun. 19, 2009, which is a divisional of U.S. application Ser. No. 10/933,053 filed Sep. 1, 2004, now U.S. Pat. No. 7,566,391, each of which is incorporated herein by reference in its entirety.

TECHNICAL FIELD

The present invention relates generally to systems and methods for removing materials from microfeature workpieces with organic and/or non-aqueous electrolytic media.

BACKGROUND

Microfeature workpieces and workpiece assemblies typically include a semiconductor material having features, such as memory cells, that are linked with conductive lines. The conductive lines can be formed by first forming trenches or other recesses in the semiconductor material and then overlaying a conductive material (such as a metal) in and adjacent to the trenches. The conductive material adjacent to the trenches is then selectively removed to leave conductive lines or vias extending from one feature in the semiconductor material to another.

FIG. 1 is a partially schematic illustration of a portion of a microfeature workpiece 10 having a conductive line formed in accordance with the prior art. The microfeature workpiece 10 includes an aperture or recess 16 in an oxide material 13. A barrier layer 14, formed from materials such as tantalum or tantalum compounds, is disposed on the microfeature workpiece 10 and in the aperture 16. A conductive material 15, such as copper, is then disposed on the barrier layer 14. The barrier layer 14 can prevent copper atoms from migrating into the surrounding oxide 13.

In a typical existing process, two separate chemical-mechanical planarization (CMP) steps are used to remove the excess portions of the conductive material 15 and the barrier layer 14 from the microfeature workpiece 10. In one step, a first slurry and polishing pad are used to remove the conductive material 15 overlying the barrier layer 14 external to the aperture 16, thus exposing the barrier layer 14. In a separate step, a second slurry and a second polishing pad are then used to remove the barrier layer 14 (and the remaining conductive material 15) external to the aperture 16. The resulting conductive line 8 includes the conductive material 15 surrounded by a lining formed by the barrier layer 14.

One drawback with the foregoing process is that high downforces are typically required to remove copper and (particularly) tantalum from the microfeature workpiece 10. High downforces can cause other portions of the microfeature workpiece 10 to become dished, scratched or eroded, and/or can smear structures in other parts of the microfeature workpiece 10. A further drawback is that high downforces typically are not compatible with soft substrate materials. However, it is often desirable to use soft materials, such as ultra low dielectric materials, around the conductive features to reduce and/or eliminate electrical coupling between these features.

DETAILED DESCRIPTION

Figure 1:
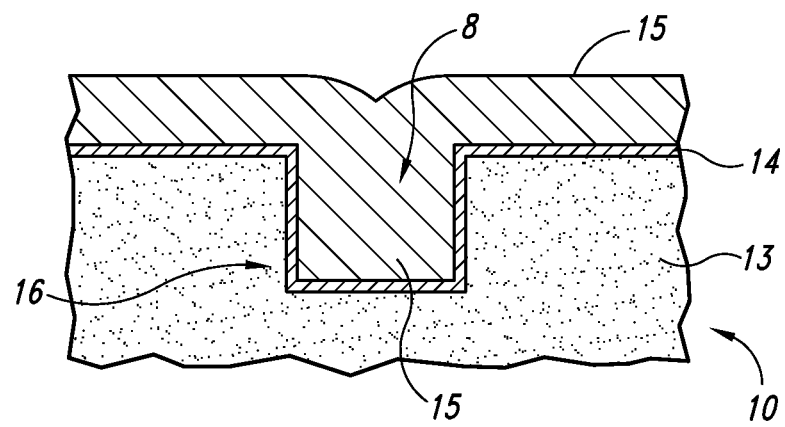
FIG. 1 is a partially schematic, cross-sectional view of a portion of a microfeature workpiece having multiple conductive materials processed in accordance with the prior art.

The present invention is directed toward methods and systems for removing material from microfeature workpieces by electrochemical-mechanical polishing (ECMP). A method in accordance with one aspect of the invention includes providing a microfeature workpiece having a substrate material and a conductive layer positioned adjacent to a surface of the substrate material, with the conductive layer including at least one of a refractory metal and a refractory metal compound. The method can further include disposing a generally organic and/or generally non-aqueous electrolytic medium in contact with the conductive layer, and positioning first and second electrodes in electrical communication with the conductive layer, with at least one of the electrodes being spaced apart from the workpiece. The method can still further include removing at least a portion of the conductive layer by passing an electrical current along an electrical path that includes the first electrode, the electrolytic medium, and the second electrode.

In further embodiments of the invention, both the first and second electrodes can be spaced apart from the microfeature workpiece. The electrolytic medium can be selected to include methanol or another alcohol. The electrolytic medium can further include a corrosion inhibitor, $NH_4Cl$, $CuCl_2$, K-succinate, $NH_4$-succinate, ammonium acetate and/or hydrogen fluoride. The conductive layer can include a barrier layer deposited beneath a blanket layer (e.g., a copper or a copper compound blanket layer), and the method can include removing at least part of the blanket layer before removing the barrier layer. The portion of the barrier layer can be removed with or without contact between the barrier layer and a polishing pad material.

Another embodiment of the invention is directed to a system for removing material from a microfeature workpiece. The system can include a workpiece support configured to carry a microfeature workpiece at a workpiece location, first and second electrodes positioned proximate to the workpiece support with at least one of the electrodes spaced apart from the workpiece location, and a polishing medium positioned at least proximate to the workpiece location. At least one of the polishing medium and the workpiece support can be movable relative to the other, and the polishing medium can include a polishing pad material and an electrolytic medium. The electrolytic medium can be generally organic and/or generally non-aqueous, and can include a solvent and an electrolyte. In further embodiments, the electrolytic medium can include methanol or another alcohol, and the electrolytic medium can be approximately 99% or more organic, and/or 90% or more non-aqueous. The system can also include an electrical current source coupled to the first and second electrodes.

As used herein, the terms "microfeature workpiece" or "workpiece" refer to substrates on and/or in which microelectronic devices are integrally formed. Typical microdevices include microelectronic circuits or components, thin-film recording heads, data storage elements, microfluidic devices, and other products. Micromachines and micromechanical devices are included within this definition because they are manufactured using much of the same technology that is used in the fabrication of integrated circuits. The substrates can be semiconductive pieces (e.g., doped silicon wafers or gallium arsenide wafers), nonconductive pieces (e.g., various ceramic substrates) or conductive pieces. In some cases, the workpieces are generally round, and in other cases the workpieces have other shapes, including rectilinear shapes. Several embodiments of systems and methods for removing material from microfeature workpieces via electrochemical-mechanical polishing (ECMP) are described below. A person skilled in the relevant art will understand, however, that the invention may have additional embodiments, and that the invention may be practiced without several of the details of the embodiments described below with reference to FIGS. 2A-8.

One approach for addressing some of the drawbacks described above with reference to FIG. 1 is to remove conductive materials from the microfeature workpiece with electrolytic processes. Accordingly, a voltage is applied to the conductive material in the presence of an electrolytic liquid to remove the conductive material. However, many existing electrolytic liquids cannot simultaneously remove copper and tantalum, once the tantalum barrier layer has been exposed. Accordingly, chemical-mechanical planarization (CMP) techniques are typically used to remove the exposed tantalum barrier layer and the adjacent copper material. However, this approach typically re-introduces the high downforces that the initial electrolytic process was intended to avoid. The following disclosure describes methods and apparatuses for overcoming this drawback.

Figure 2A:
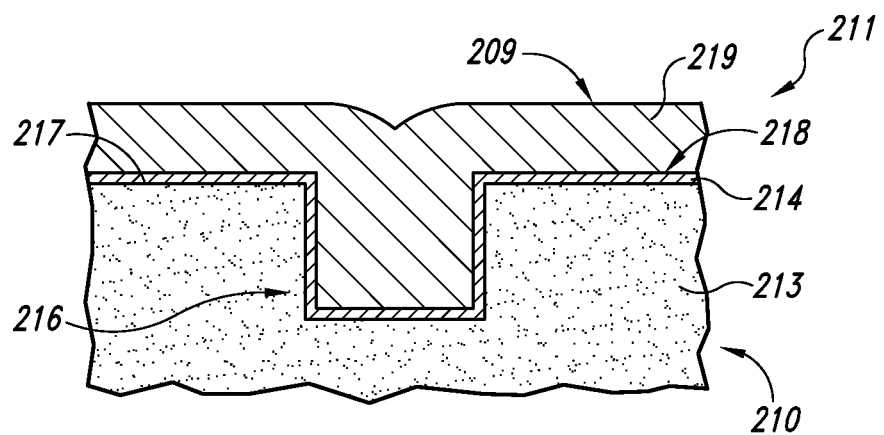
FIGS. 2A-2D are partially schematic, cross-sectional illustrations of a portion of a microfeature workpiece having conductive materials processed in accordance with an embodiment of the invention.

FIG. 2A is a partially schematic, cross-sectional side view of a microfeature workpiece 210 prior to electrolytic processing in accordance with an embodiment of the invention. In one aspect of this embodiment, the microfeature workpiece 210 includes a substrate material 213, such as an oxide (e.g., silicon dioxide) or a low dielectric constant material (e.g., borophosphate silicon glass or tetraethylorthosilicate). The substrate material 213 can include a substrate material surface 217 having a recess or aperture 216 formed by conventional processes, including selective etch processes. A first conductive material 218 is disposed on the substrate material 213 and can form a barrier layer 214 along the walls of the recess 216. A second conductive material 209, such as a blanket fill material, can be disposed on the first conductive material 218 to form a fill or blanket layer 219. In one embodiment, the first conductive material 218 can include a refractory metal, e.g., tantalum or a tantalum compound, including tantalum nitride ($TaN_x$). The second conductive material 209 can include copper or copper alloys, including alloys that have at least 50% copper. In other embodiments, these conductive materials can include other elements or compounds. For example, the first conductive material 218 can include titanium or a titanium compound, including titanium nitride ($TiN_x$). Many if not all of the points described below in the context of tantalum-containing first conductive materials 218 can also apply to titanium-containing first conductive materials, and first conductive materials 218 containing other refractory metals and/or refractory metal compounds. In any of these embodiments, the first conductive material 218 and the second conductive material 209 can collectively define a conductive portion 211 of the microfeature workpiece 210.

To form an isolated conductive line within the recess 216, the first conductive material 218 and the second conductive material 209 external to the recess 216 are typically removed. In one embodiment, the second conductive material 209 is removed using a CMP process. In other embodiments, an electrochemical-mechanical polishing (ECMP) process or an electrolytic process is used to remove the second conductive material 209. An advantage of electrolytic and ECMP processes is that the downforce applied to the microfeature workpiece 210 during at least some phases of processing can be reduced or in some cases eliminated.

Figure 2B:
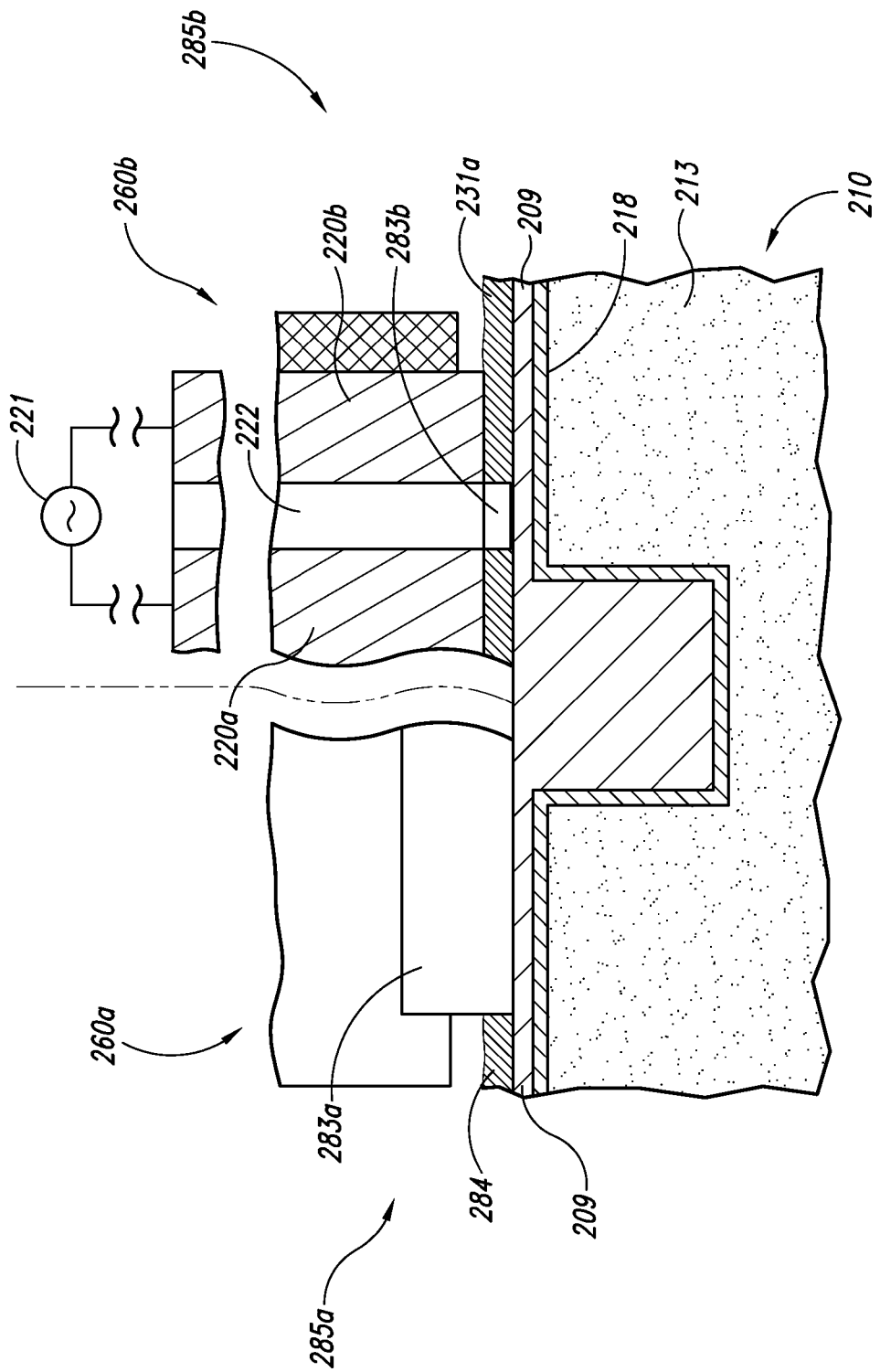

FIG. 2B illustrates, in a split view, portions of both a CMP and an ECMP system for removing an initial portion of the second conductive material 209 from the workpiece 210. For purposes of illustration, portions of both systems are shown in FIG. 2B removing material from a single workpiece 210. In most embodiments, one system or the other is selected to remove the initial portion of the second conductive material 209 from a given workpiece 210. A CMP system 260a in accordance with one embodiment of the invention includes a polishing medium 285a having a polishing pad material 283a and a polishing liquid 284 in contact with the second conductive material 209. The polishing liquid 284 can include a conventional slurry (e.g., having a suspension of abrasive elements), or the abrasive elements can be fixedly embedded in the polishing pad material 283a. As the polishing medium 285a and the workpiece 210 move relative to each other, an initial portion of the second conductive material 209 is removed to expose the first conductive material 218.

An ECMP system 260b in accordance with an embodiment of the invention includes a polishing medium 285b having at least two electrodes 220 (two are shown in FIG. 2B as a first electrode 220a and a second electrode 220b), separated by an insulator 222. The electrodes 220 can be coupled to an electrical power source 221, for example, a variable signal transmitter or a DC power source. The polishing medium 285b can further include a polishing pad material 283b, which contacts the second conductive material 209 of the workpiece 210. In another embodiment, the polishing pad material 283b can extend between the electrodes 220a and 220b to replace the insulator 222, while providing the same insulative function. In either embodiment, a first electrolytic medium 231a (e.g., an electrolyte-containing liquid or gel) can be disposed between the electrodes 220 and the second conductive material 209. In a particular embodiment, the first electrolytic medium 231a can include phosphoric acid. The first electrolytic medium 231a can form part of an electrically conductive path that also includes the first electrode 220a, the second electrode 220b, and optionally the second conductive material 209.

In operation, an initial portion of the second conductive material 209 can be removed from the workpiece 210 (a)

electrolytically via the current supplied by the power source 221, and/or (b) chemically/mechanically as a result of both the chemical interaction between the first electrolytic medium 231a and the second conductive material 209, and the contact and relative motion between the polishing pad material 283b and the workpiece 210. The ECMP system 260b can be operated in different manners, depending on the nature of the workpiece 210 and/or the desired processing parameters. For example, the ECMP system 260b can be operated to remove material via only chemical-mechanical polishing by not activating the electrodes 220, or the ECMP system 260b can be operated to remove material via only electrolytic action by activating the electrodes 220 but not contacting the workpiece 210 with the polishing pad material 283b. The ECMP system 260b can remove material via ECMP by both activating the electrodes 220 and contacting the workpiece 210 with the polishing pad material 283b. Any of the foregoing processes can be conducted at least until the initial portion of the second conductive material 209 is removed to expose the first conductive material 218.

Figure 2C:
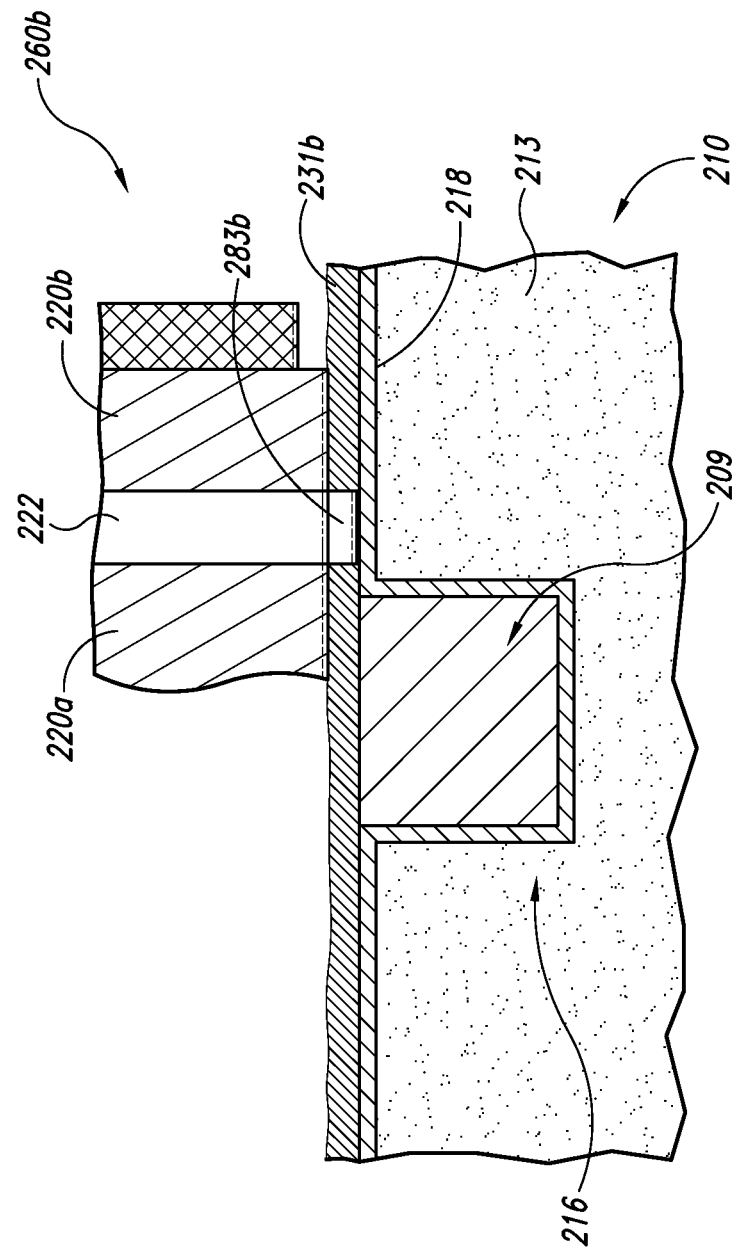

FIG. 2C illustrates the ECMP system 260b positioned to remove the exposed first conductive material 218 in accordance with an embodiment of the invention. In one aspect of this embodiment, the first electrolytic medium 231a described above with reference to FIG. 2B is replaced with a second electrolytic medium 231b having a different composition. Accordingly, the first electrolytic medium 231a can be removed during a flushing or rinsing operation. The second electrolytic medium 231b can include a corrosion inhibitor that inhibits removal of the remaining second conductive material 209 in the recess 216. An advantage of this feature is that the second conductive material 209 in the recess 216 is less likely to become "dished" or otherwise removed in a non-uniform fashion, and is more likely to remain flush and level with the surrounding material. In other embodiments (for example, when dishing is not of particular concern), the second electrolytic medium 231b can have the same composition as the first electrolytic medium 231a.

The second electrolytic medium 231b can have a generally organic (i.e., carbon-containing) composition. For example, the second electrolytic medium 231b can include methanol, ethanol, or another alcohol as a solvent. When the first conductive material includes tantalum, the second electrolytic medium can further include $NH_4Cl$, $CuCl_2$, ammonium acetate, and/or other monovalence organic salts. These compounds can be particularly suitable in cases where the first conductive material 218 includes tantalum or tantalum nitride, the second conductive material 209 includes copper and/or a copper compound, and the removal process need not remove the first conductive material 218 more rapidly than the second conductive material 209 (and in fact may remove the second conductive material 209 more rapidly). In other embodiments, the second electrolytic medium 231b can include $NH_4$-succinate, K-succinate and/or other monovalence succinate salts. These compounds can be particularly suitable in cases where it is desirable to remove the second conductive material 209 more rapidly than the first conductive material 218. When the first conductive material 218 includes tantalum nitride, the second electrolytic medium 231b can include hydrogen fluoride in an alcohol or another organic solvent. An advantage of hydrogen fluoride is that it can remove tantalum nitride at a more rapid rate than copper. In one aspect of either embodiment, the second electrolytic medium 231b can be at least approximately 99% organic (e.g., it can contain at least 99% organic constituents, rather than non-carbon-containing constituents, by volume).

The second electrolytic medium 231b can also be generally non-aqueous. For example, when the second electrolytic medium 231b includes hydrogen fluoride, the overall composition of the second electrolytic medium 231b can be about ten percent aqueous or less. When the second electrolytic medium includes other constituents (e.g., $NH_4Cl$, $CuCl_2$, ammonium acetate, $NH_4$-succinate, and/or K-succinate), the overall composition of the second electrolytic medium 231b can be about one percent aqueous or less.

One feature of an embodiment of the foregoing system is that the generally organic (and/or non-aqueous) second electrolytic medium 231b can remove the first conductive material 218 from the workpiece 210 without requiring high downforces even if (in some cases) higher downforces are used to remove the initial portion of the second conductive material 209. For example, when the first conductive material 218 includes tantalum or tantalum nitride, the downforce applied to the workpiece 210 while the first conductive material 218 is being removed can be from about 1.0 psi to zero psi. In one particular embodiment, the downforce can range from about 0.25 psi to about 0.1 psi or less, and in another particular embodiment, the downforce can be about 0.1 psi or less. By contrast, the typical downforce used to remove the first conductive material in conventional processes is generally from about 2.0 psi to about 5.0 psi. Because the downforce is reduced to such low levels, (a) the likelihood for dishing the second conductive material 209 remaining in the recess 216 can be reduced or eliminated, and/or (b) the likelihood for scratching or otherwise damaging the substrate material 213 when the overlying first conductive material 218 is removed can also be reduced or eliminated.

In a particular embodiment for which the first conductive material 218 includes tantalum nitride, the polishing pad material 283b can contact the first conductive material 218 with a vanishingly small downforce. In still another embodiment, the polishing pad material 283b can be out of contact with the workpiece 210 (as indicated by dashed lines in FIG. 2C) or eliminated entirely (as indicated by phantom lines in FIG. 2C). In either embodiment, most or all of the first conductive material 218 external to the recess 216 can be removed with little or no contact between the polishing pad material 283b and the first conductive material 218. In some cases, small amounts of residual first conductive material 218 remaining after the electrolytic process described above can be removed by very light contact, provided by the polishing pad material 283b or another device (e.g., a brush).

Another feature of the foregoing embodiments is that one or more of the constituents of the second electrolytic medium 231b can preferentially remove the first conductive material 218. For example, when the first conductive material 218 includes tantalum, and the second conductive material 209 includes copper, both disposed in a tetraethylorthosilicate (TEOS) substrate material 213, the second electrolytic medium 231b can include K-succinate in methanol, which can remove tantalum approximately twice as fast as it removes copper, and can remove little or no TEOS. Accordingly, the second electrolytic medium 231b can remove the first conductive material 218 without dishing the second conductive material 209 and/or without scratching the substrate material 213. It is believed that one explanation for the foregoing behavior is that the second electrolytic medium 231b forms a stable copper-organic complex or other low solubility copper-organic compound at the interface between the copper and the electrolytic medium 231b. Accordingly, the second electrolytic medium 231b passivates the copper while retaining electrolytic properties. The copper-organic complex can be stable in the solid phase, and can have a limited or zero solubility in the second electrolytic medium 231b. The process performed by the second electrolytic medium 231b is therefore unlike that of typical passivating agents, including BTA, which are generally ineffective in a non-aqueous solution, and/or are not stable in the presence of an external electrical current.

Yet another feature of an embodiment of the second electrolytic medium 231b is that, whether it is generally organic, generally non-aqueous, or both, it can effectively remove tantalum and tantalum compounds at rates higher than those available with conventional methods, and/or with downforces lower than those associated with conventional methods. It is believed that at least one mechanism by which embodiments of the second electrolytic medium 231b achieve this result is by reducing and/or eliminating the passivation of tantalum into tantalum oxide ($TaO_x$).

Figure 2D:
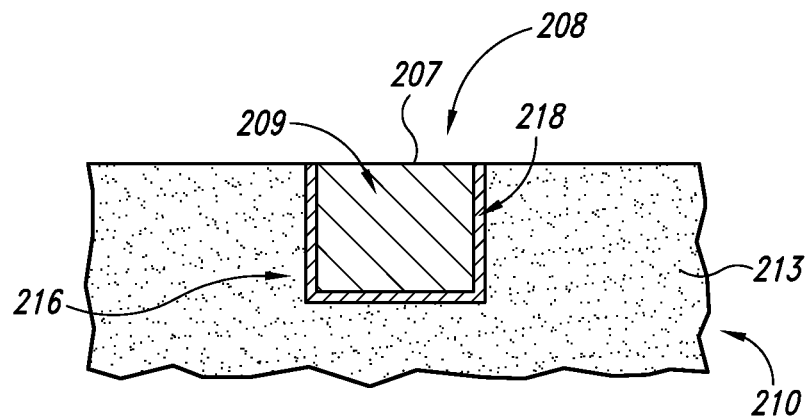

In any of the foregoing embodiments, the first conductive material 218 and the second conductive material 209 external to the recess 216 can be removed to produce a microfeature workpiece 210 having an embedded conductive structure 208, as shown in FIG. 2D. In one embodiment, the conductive structure 208 can include a conductive line and in other embodiments, conductive structure 208 can include a via or other feature in the microfeature workpiece 210. In any of these embodiments, the foregoing processes can provide a conductive structure 208 having a smooth external surface 207 that includes smooth external surface portions for both the first conductive material 218 and the second conductive material 209.

Figure 3:
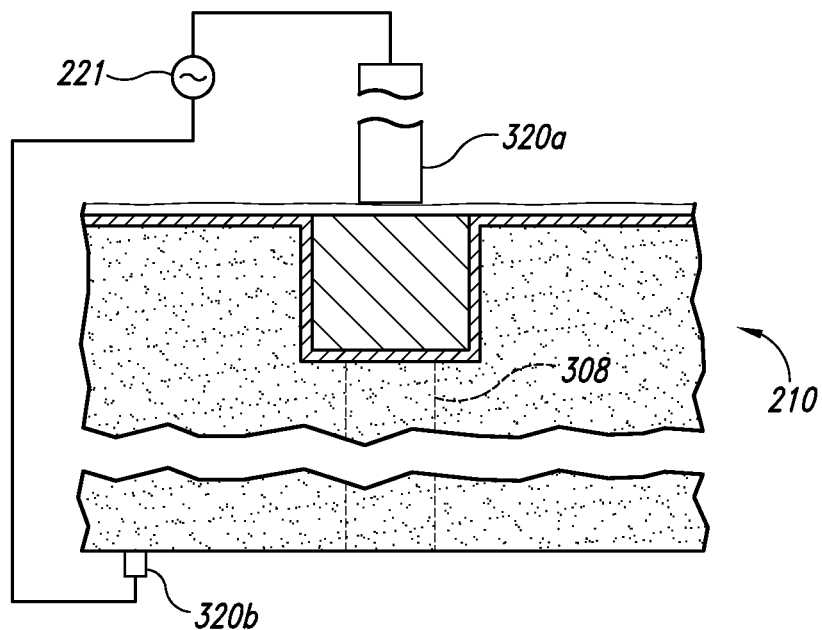
FIG. 3 is a partially schematic, cross-sectional view of a portion of a microfeature workpiece having conductive materials processed in accordance with another embodiment of the invention.

In the embodiments described above with reference to FIGS. 2A-2D, both the first and second electrodes 220a, 220b are spaced apart from the microfeature workpiece 210 as they remove conductive materials from the microfeature workpiece 210. An advantage of this arrangement is that the conductive material removal process can be relatively uniform. Another advantage of this arrangement is that it reduces the direct, physical contact with the workpiece 210 as the conductive materials are removed. In other embodiments, one or more of the electrodes 220 can be positioned in direct contact with the microfeature workpiece 210. For example, as shown in FIG. 3, a first electrode 320a can be positioned in a spaced-apart orientation relative to the microfeature workpiece 210, and a second electrode 320b can be connected to a rear surface of the microfeature workpiece 210. A conductive path 308 (e.g., an internal via) between the rear surface and the conductive portion 211 of the microfeature workpiece can complete the circuit between the electrodes 320a, 320b, allowing the signal transmitter 221 to remove conductive material in a manner generally similar to that described above.

FIGS. 4-8 illustrate apparatuses for electrolytically, chemically-mechanically, and/or electrochemically-mechanically removing material from microfeature workpieces to perform the processes described above with reference to FIGS. 2A-3. For purposes of illustration, the apparatuses are shown supporting the microfeature workpiece 210 face-down against an upwardly facing polishing pad. In other embodiments, the relative positions and orientations of the workpiece 210 and the polishing pad can be reversed, as shown in FIGS. 2B-3.

Figure 4:
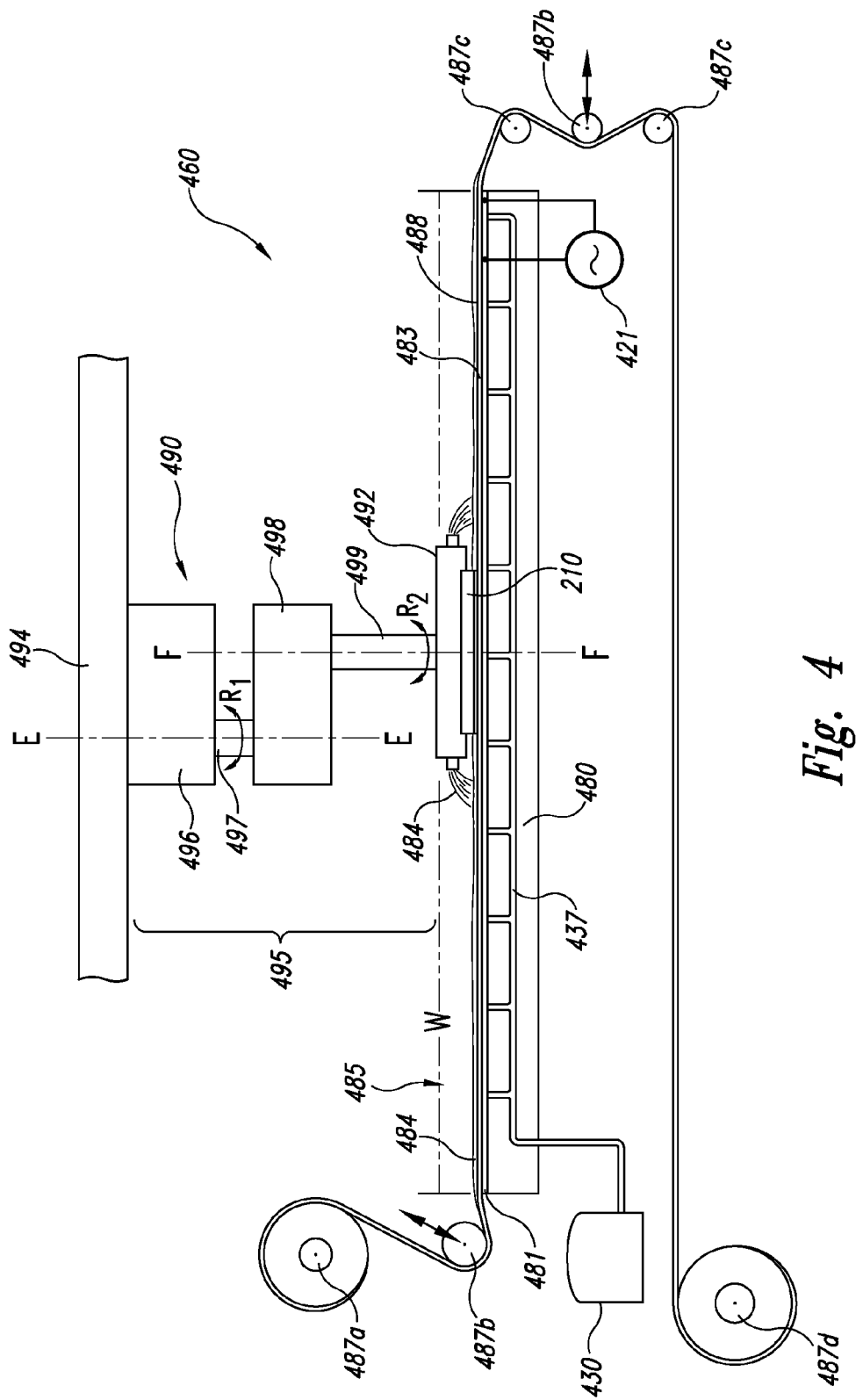
FIG. 4 is a partially schematic illustration of an apparatus for electrolytically, chemically-mechanically and/or electrochemically-mechanically removing conductive materials from a microfeature workpiece in accordance with still another embodiment of the invention.

FIG. 4 schematically illustrates an apparatus 460 for electrolytically, chemically-mechanically and/or electrochemically-mechanically polishing the microfeature workpiece 210 in accordance with an embodiment of the invention. In one aspect of this embodiment, the apparatus 460 has a support table 480 with a top-panel 481 at a workstation where an operative portion "W" of a polishing pad 483 is positioned. The top-panel 481 is generally a rigid plate to provide a flat, solid surface to which a particular section of the polishing pad 483 may be secured during polishing. The polishing pad 483 can have a relatively soft composition which, together with the relatively low down force described above, can reduce the likelihood for scratching the workpiece 210 and/or removing material from the workpiece 210 in a non-uniform manner. In one embodiment, the polishing pad 483 can include a Politex™ pad, available from Rohm and Haas of Phoenix, Ariz., and in other embodiments, the polishing pad 483 can include other relatively soft pads available from other sources.

The apparatus 460 can also have a plurality of rollers to guide, position and hold the polishing pad 483 over the top-panel 481. The rollers can include a supply roller 487a, idler rollers 487b, guide rollers 487c, and a take-up roller 487d. The supply roller 487a carries an unused or preoperative portion of the polishing pad 483, and the take-up roller 487d carries a used or postoperative portion of the polishing pad 483. Additionally, the idler rollers 487b and the guide rollers 487c can stretch the polishing pad 483 over the top-panel 481 to hold the polishing pad 483 stationary during operation. A motor (not shown) drives at least one of the supply roller 487a and the take-up roller 487d to sequentially advance the polishing pad 483 across the top-panel 481. Accordingly, clean preoperative sections of the polishing pad 483 may be quickly substituted for used sections to provide a consistent surface for polishing and/or cleaning the microfeature workpiece 210.

The apparatus 460 can also have a carrier assembly 490 that controls and protects the microfeature workpiece 210 during polishing. The carrier assembly 490 can include a workpiece holder 492 to pick up, hold and release the microfeature workpiece 210 at appropriate stages of the polishing process. The carrier assembly 490 can also have a support gantry 494 carrying a drive assembly 495 that can translate along the gantry 494. The drive assembly 495 can have an actuator 496, a drive shaft 497 coupled to the actuator 496, and an arm 498 projecting from the drive shaft 497. The arm 498 carries the workpiece holder 492 via a terminal shaft 499 such that the drive assembly 495 orbits the workpiece holder 492 about an axis E-E (as indicated by arrow "$R_1$"). The terminal shaft 499 may also rotate the workpiece holder 492 about its central axis F-F (as indicated by arrow "$R_2$").

The polishing pad 483 and a polishing liquid 484 define a polishing medium 485 that electrolytically, chemically-mechanically, and/or electro-chemically-mechanically removes material from the surface of the microfeature workpiece 210. In some embodiments, the polishing pad 483 may be a non-abrasive pad without abrasive particles, and the polishing liquid 484 can be a slurry with abrasive particles and chemicals to remove material from the microfeature workpiece 210. In other embodiments, the polishing pad 483 can be a fixed-abrasive polishing pad in which abrasive particles are fixedly bonded to a suspension medium. To polish the microfeature workpiece 210 with the apparatus 460, the carrier assembly 490 can position the microfeature workpiece 210 with a process surface of the workpiece 210 at a workpiece location in contact with the polishing liquid 484. Optionally the carrier assembly 490 can also press the microfeature workpiece 210 against a polishing surface 488 of the polishing pad 483. The drive assembly 495 then orbits the workpiece holder 492 about the axis E-E and optionally rotates the workpiece holder 492 about the axis F-F to translate the substrate 210 across the polishing surface 488. As a result, the abrasive particles and/or the chemicals in the polishing medium 485 and/or electrolytic action remove material from the surface of the microfeature workpiece 210 in a chemical and/or chemical-mechanical and/or electrochemical-mechanical polishing process.

During ECMP processing, the polishing liquid 484 can include an electrolyte which can be pre-mixed in the polishing liquid 484 or stored in an electrolyte supply vessel 430 and delivered with a conduit 437, as described in greater detail below with reference to FIG. 5. In either embodiment, the apparatus 460 can further include a current supply 421 coupled to electrodes positioned proximate to the polishing pad 483.

Figure 5:
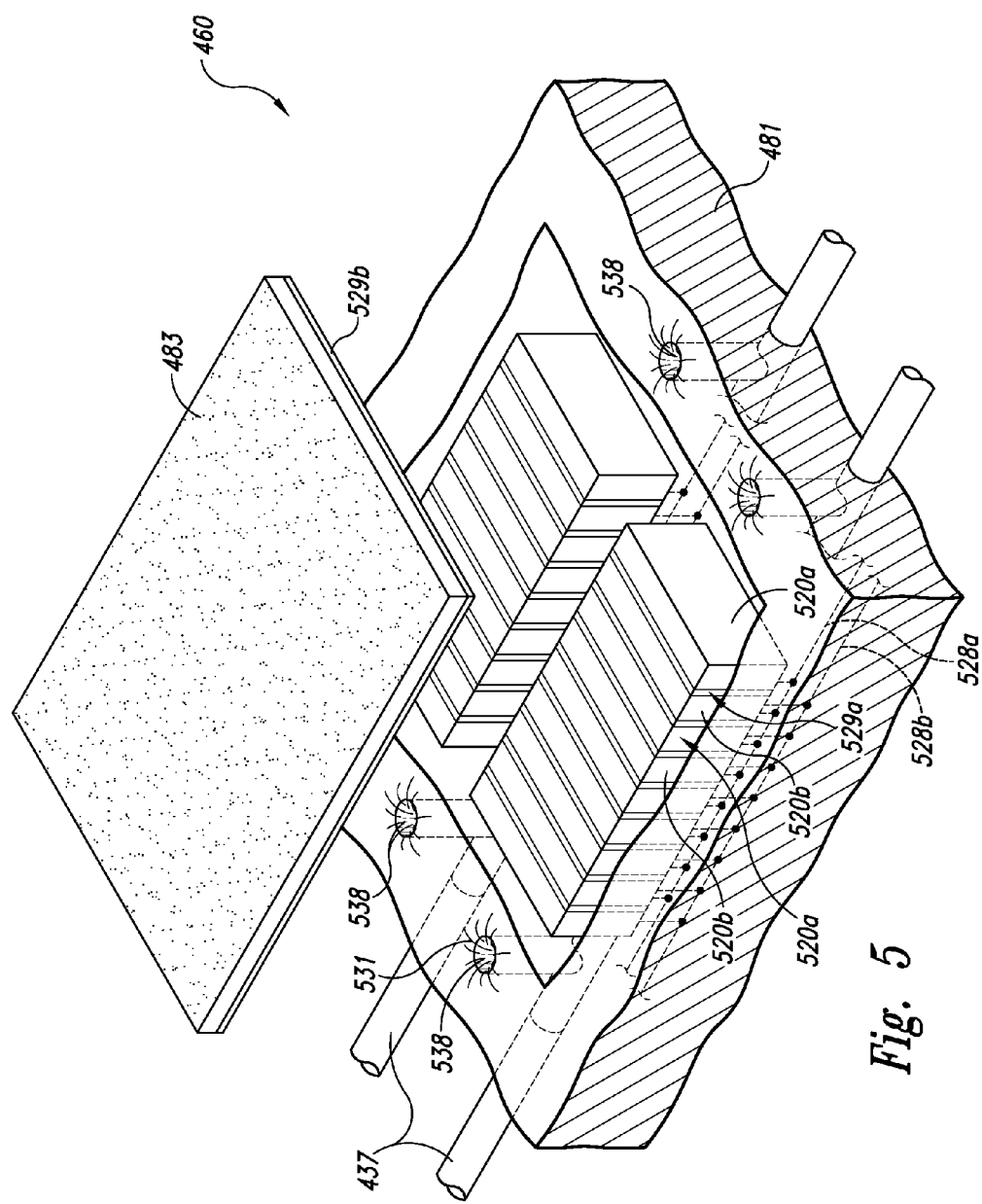
FIG. 5 is a partially schematic, isometric view of a portion of the apparatus shown in FIG. 4.

FIG. 5 is a partially exploded, partially schematic isometric view of a portion of the apparatus 460 described above with reference to FIG. 4. In one aspect of the embodiment shown in FIG. 5, the top-panel 481 houses a plurality of electrode pairs, each of which includes a first electrode 520a and a second electrode 520b. The first electrodes 520a are coupled to a first lead 528a and the second electrodes 520b are coupled to a second lead 528b. The first and second leads 528a and 528b are coupled to the current supply 421 (FIG. 4). In one aspect of this embodiment, the first electrodes 520a can be separated from the second electrodes 520b by an electrode dielectric layer 529a that includes Teflon™ or another suitable dielectric material. The electrode dielectric layer 529a can accordingly control the volume and dielectric constant of the region between the first and second electrodes 520a and 520b to control the electrical coupling between the electrodes.

The electrodes 520a and 520b can be electrically coupled to the microfeature workpiece 210 (FIG. 4) by the polishing pad 483. In one aspect of this embodiment, the polishing pad 483 is saturated with an electrolytic liquid 531 supplied by the supply conduits 437 through apertures 538 in the top-panel 481 just beneath the polishing pad 483. Accordingly, the electrodes 520a and 520b are selected to be compatible with the electrolytic liquid 531. In an another arrangement, the electrolytic liquid 531 can be supplied to the polishing pad 483 from above (for example, by disposing the electrolytic liquid 531 in the polishing liquid 489, rather than by directing the electrolytic liquid upwardly through the polishing pad 483). Accordingly, the apparatus 460 can include a pad dielectric layer 529b positioned between the polishing pad 483 and the electrodes 520a and 520b. When the pad dielectric layer 529b is in place, the electrodes 520a and 520b can be isolated from physical contact with the electrolytic liquid 531 and can accordingly be selected from materials that are not necessarily compatible with the electrolytic liquid 531.

Figure 6:
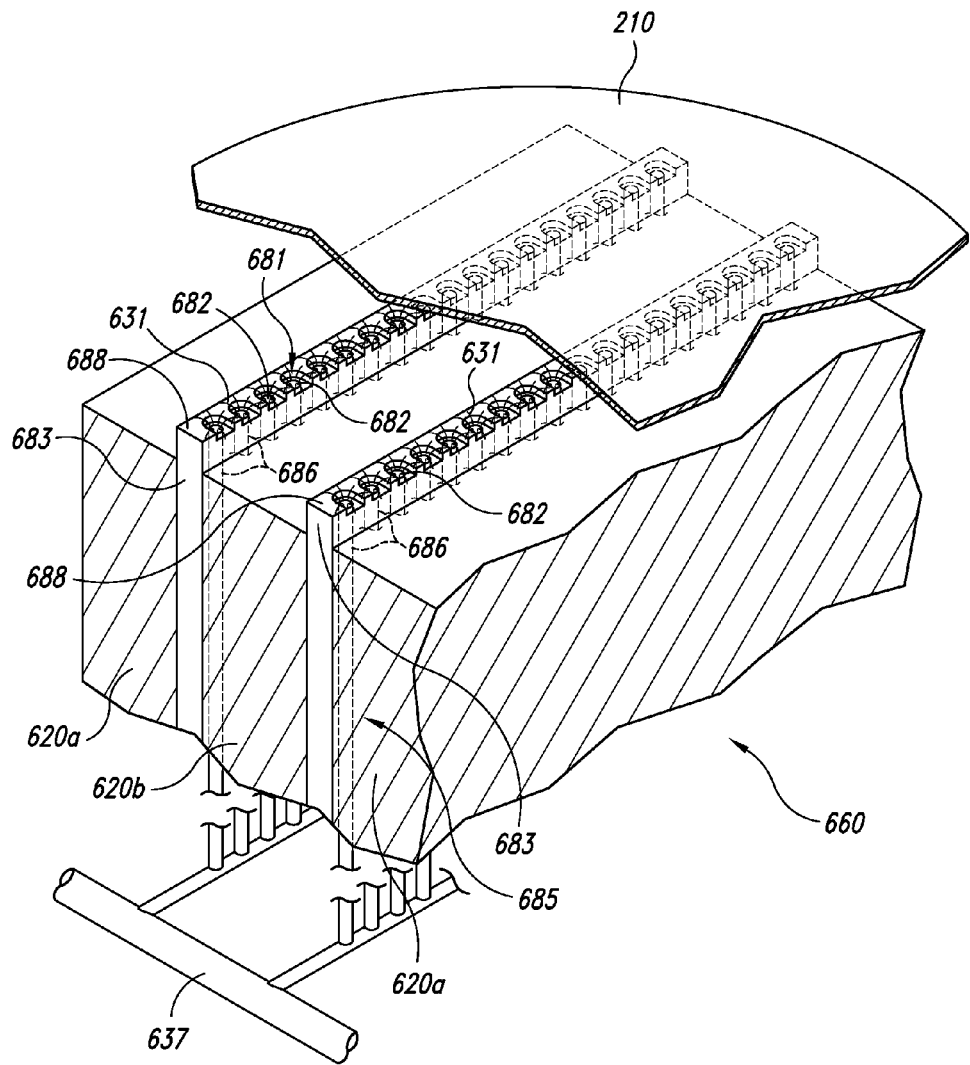
FIG. 6 is a partially schematic, isometric illustration of a portion of an apparatus for removing conductive materials from a microfeature workpiece in accordance with yet another embodiment of the invention.

FIG. 6 is an isometric view of a portion of an apparatus 660 having electrodes 620 (shown as a first electrode 620a and a second electrode 620b), and a polishing medium 685 arranged in accordance with another embodiment of the invention. In one aspect of this embodiment, the polishing medium 685 includes polishing pad portions 683 that project beyond the electrodes 620a and 620b. Each polishing pad portion 683 can include a polishing surface 688 and a plurality of flow passages 686 coupled to a fluid source (not shown in FIG. 6) with a conduit 637. Each flow passage 686 can have an aperture 682 proximate to the polishing surface 688 to provide an electrolytic liquid 631 proximate to an interface between the microfeature workpiece 210 and the polishing surface 688. In one aspect of this embodiment, the pad portions 683 can include recesses 681 surrounding each aperture 682. Accordingly, the electrolytic liquid 631 can proceed outwardly from the flow passages 686 while the microfeature workpiece 210 is positioned directly overhead and remains spaced apart from the electrodes 620. In other embodiments, the polishing pad portions 683 can be applied to other electrodes, such as those described above with reference to FIGS. 4 and 5 to provide for mechanical as well as electromechanical material removed.

Figure 7:
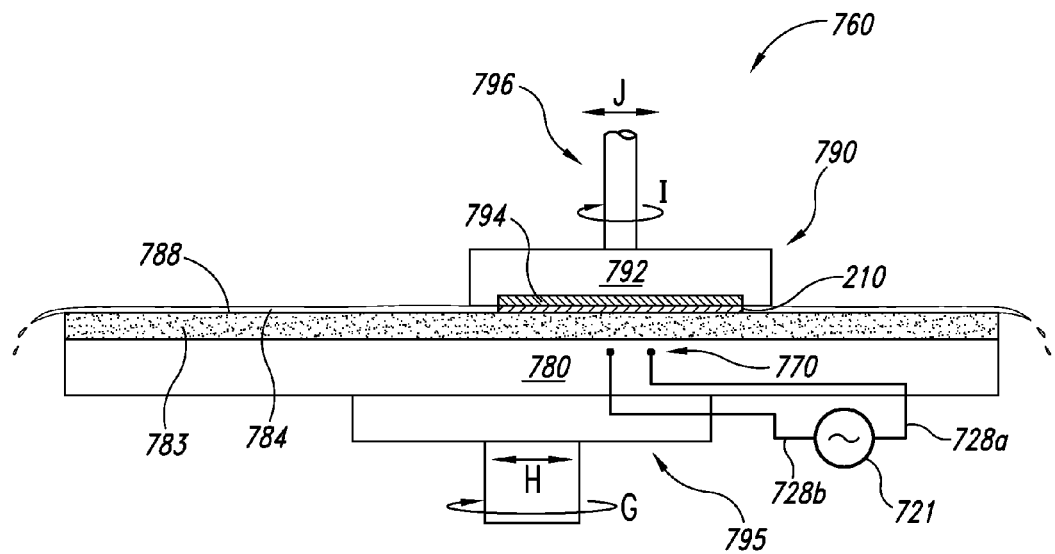
FIG. 7 is a schematic illustration of a rotary apparatus for removing material from a microfeature workpiece in accordance with another embodiment of the invention.

FIG. 7 is a partially schematic, cross-sectional side elevational view of a rotary apparatus 760 for mechanically, chemically and/or electrolytically processing the microfeature workpiece 210 in accordance with another embodiment of the invention. In one aspect of this embodiment, the apparatus 760 has a generally circular platen or table 780, a carrier assembly 790, a polishing pad 783 positioned on the table 780, and a polishing liquid 784 on the polishing pad 783. The polishing pad 783 can be a fixed abrasive polishing pad or, alternatively, the polishing liquid 784 can include slurry having a suspension of abrasive elements and the polishing pad 783 can be a non-abrasive pad. A drive assembly 795 rotates (arrow "G") and/or reciprocates (arrow "H") the platen 780 to move the polishing pad 783 during planarization. Accordingly, the motion of the microfeature workpiece 210 relative to the polishing pad 783 can include circular, elliptical, orbital, precessional or non-precessional motions.

The carrier assembly 790 controls and protects the microfeature workpiece 210 during the material removal process. The carrier assembly 790 typically has a substrate holder 792 with a pad 794 that holds the microfeature workpiece 210 via suction. A drive assembly 796 of the carrier assembly 790 typically rotates and/or translates the substrate holder 792 (arrows "I" and "J," respectively). Alternatively, the substrate holder 792 may include a weighted, free-floating disk (not shown) that slides over the polishing pad 783.

To remove material from the microfeature workpiece 210 with the apparatus 760 in one embodiment, the carrier assembly 790 positions the microfeature workpiece 210 and (optionally) presses the microfeature workpiece 210 against a polishing surface 788 of the polishing pad 783. The platen 780 and/or the substrate holder 792 then move relative to one another to translate the microfeature workpiece 210 across the polishing surface 788. As a result, the abrasive particles in the polishing pad 783 and/or the chemicals in the planarizing liquid 784 remove material from the surface of the microfeature workpiece 210.

The apparatus 760 can also include a current source 721 coupled with leads 728a and 728b to one or more electrode pairs 770 (one of which is shown in FIG. 11). The electrode pairs 770 can be integrated with the platen 780 in generally the same manner with which the electrodes 520a and 520b (FIG. 5) are integrated with the top panel 581 (FIG. 5). Alternatively, the electrode pairs 770 can be integrated with the polishing pad 783. In either embodiment, the electrode pairs 770 can include electrodes having shapes and configurations generally similar to any of those described above with reference to FIGS. 3-6 to electrolytically remove conductive material from the microfeature workpiece 210.

Figure 8:
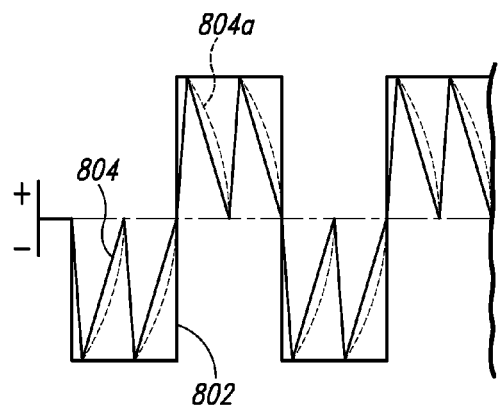
FIG. 8 is a schematic illustration of a waveform for electrolytically processing a microfeature workpiece in accordance with still another embodiment of the invention.

The foregoing apparatuses described above with reference to FIGS. 4-7 can be used to electrolytically, chemically-mechanically and/or electrochemically-mechanically process the microfeature workpiece 210. When the apparatuses are used to electrolytically or electrochemically-mechanically process the microfeature workpiece 210, they can provide a varying electrical current that passes from the electrodes, through the conductive material of the microfeature workpiece 210 via the electrolytic liquid. For example, as shown in FIG. 8, the apparatus can generate a high-frequency wave 804 and can superimpose a low-frequency wave 802 on the high-frequency wave 804. In one aspect of this embodiment, the high-frequency wave 804 can include a series of positive or negative voltage spikes contained within a square wave envelope defined by the low-frequency wave 802. Each spike of the high-frequency wave 804 can have a relatively steep rise-time slope to transfer charge through the dielectric material to the electrolytic liquid, and a more gradual fall-time slope. The fall-time slope can define a straight line, as indicated by high-frequency wave 804, or a curved line, as indicated by high-frequency wave 804a. In other embodiments, the high-frequency wave 804 and the low-frequency wave 802 can have other shapes depending, for example, on the particular characteristics of the dielectric material and the electrolytic liquid, the characteristics of the micro feature workpiece 210, and/or the target rate at which conductive material is to be removed from the microfeature workpiece 210.

The voltage applied to the workpiece 210 can be selected based on the material removed from the workpiece 210. For example, when removing tantalum from the workpiece 210, the current can be applied at a potential of 7.8 volts rms. When tantalum nitride is removed from the workpiece 210, the current can be applied at a potential of about 15 volts rms. In both embodiments, the workpiece 210 can be rotated at a speed of about 30 RPM.

The methods described above with reference to FIGS. 2A-3 may be performed with the apparatuses described above with reference to FIGS. 4-8 in a variety of manners in accordance with several embodiments of the invention. For example, in one embodiment, a single apparatus can be used to remove the initial quantity of the second conductive material 209 via CMP and then the first and second conductive materials 218, 209 simultaneously via ECMP. Alternatively, one apparatus can initially remove the second material 209 (e.g., via CMP) and the same or another apparatus can subsequently remove both the first and second conductive materials 218, 209 via ECMP. In either embodiment, the liquid used during ECMP of the first conductive material 218 can be generally organic, which can significantly reduce (or eliminate) the downforce applied to the microfeature workpiece 210 during electrolytic processing.

From the foregoing, it will be appreciated that specific embodiments of the invention have been described herein for purposes of illustration, but that various modifications may be made without deviating from the spirit and scope of the invention. For example, methods and features shown and/or described in the context of certain embodiments of the invention can be eliminated, combined or re-ordered in other embodiments. Accordingly, the invention is not limited except as by the appended claims.

We claim:

1. A method for removing material from a microfeature workpiece having a substrate, a first material adjacent to a surface of the substrate, and a second material adjacent to the first material, the method comprising:
    disposing a first polishing liquid in contact with the second material, the first polishing liquid containing a generally aqueous electrolytic medium;
    removing a portion of the second material with the first polishing liquid;
    replacing the first polishing liquid with a second polishing liquid, the second polishing liquid including a generally organic electrolytic medium; and
    removing a portion of the first material with the second polishing liquid.

2. The method of claim 1 wherein disposing the first polishing liquid includes disposing the electrolytic medium including phosphoric acid.

3. The method of claim 1 wherein the second polishing liquid includes the electrolytic medium having a hydrogen fluoride in an alcohol.

4. The method of claim 1 wherein the second polishing liquid includes the electrolytic medium that is about 10% or less aqueous.

5. The method of claim 1 wherein the second polishing liquid includes the electrolytic medium that is about 1% or less aqueous.

6. The method of claim 1 wherein the second polishing liquid includes a passivating agent that inhibits removal of the second material in a recess.

7. The method of claim 6 wherein the passivating agent is selected from a group consisting of $NH_4Cl$, $CuCl_2$, ammonium acetate, $NH_4$-succinate, K-succinate, and a combination thereof.

8. The method of claim 6, further comprising forming a copper-organic complex at an interface between the second material in the recess and the second polishing liquid, wherein the copper-organic complex is in a generally stable solid phase.

9. The method of claim 1 wherein the second material comprises at least one of copper and copper compound.

10. The method of claim 9 wherein the second material comprises at least 50% copper.

11. The method of claim 1 wherein the first material comprises at least one of tantalum, titanium, tantalum nitride, titanium nitride, and a combination thereof.

12. The method of claim 1 wherein:
    removing a portion of the second material includes removing a portion of the second material by contacting the second material with a polishing pad material and applying a first pressure to the microfeature workpiece, and
    removing at least a portion of the first material includes removing at least a portion of the first material while contacting the first material with the polishing pad material and applying a second pressure that is smaller than the first pressure.

13. The method of claim 12 wherein the second pressure is smaller than 1 psi.

14. The method of claim 1 wherein removing a portion of the second material with the first polishing liquid includes removing a portion of the second material without contacting the first conductive material with a polishing pad material.

15. The method of claim 1, further comprising:
    positioning first and second electrodes in electrical communication with the first material, the second material, at least one of the first and second electrodes being spaced apart from the microfeature workpiece;
    removing a portion of the second material at a second rate by passing an electrical current along an electrical path that includes the first electrode, the first polishing liquid, the second material, and the second electrode; and
    removing at least a portion of the first material external to a recess at a first rate by passing an electrical current along an electrical path that includes the first electrode, the second polishing liquid, the first material, and the second electrode.

16. The method of claim 15 wherein passing an electrical current includes passing a varying electrical current.

17. A method for removing material from a microfeature workpiece having a substrate material, a recess in a surface of the substrate material, a first layer disposed adjacent to the surface of the substrate material and in the recess, and a second layer disposed adjacent to the first layer, the first layer including at least one of a refractory metal and a refractory metal compound, comprising:
    disposing a first polishing liquid in contact with the second layer, the first polishing liquid containing a generally aqueous electrolytic medium;

removing a first portion of the second layer external to the recess from the microfeature workpiece with the first polishing liquid;

replacing the first polishing liquid with a second polishing liquid different than the first polishing liquid, the second polishing liquid including a generally organic electrolytic medium containing an organic salt; and removing at least a portion of the first layer external to the recess and a second portion of the second layer by passing an electrical current along an electrical path that includes the first electrode, the second polishing liquid, and the second electrode, wherein the organic salt is selected such that the at least a portion of the first layer is removed faster than the second portion of the second layer when the electrical current is passed along the electrical path.

18. The method of claim 17, further comprising positioning both the first and second electrodes spaced apart from the microfeature workpiece.

19. The method of claim 17 wherein disposing a generally organic electrolytic medium includes disposing an electrolytic medium having a corrosion inhibitor that inhibits corrosion of the second layer.

20. The method of claim 17, further comprising contacting the microfeature workpiece with a polishing pad material and moving the polishing pad material and the microfeature workpiece relative to the other.

\* \* \* \* \*

UNITED STATES PATENT AND TRADEMARK OFFICE
CERTIFICATE OF CORRECTION

| | |
|---|---|
| PATENT NO. | : 8,603,319 B2 |
| APPLICATION NO. | : 13/711432 |
| DATED | : December 10, 2013 |
| INVENTOR(S) | : Whonchee Lee et al. |

It is certified that error appears in the above-identified patent and that said Letters Patent is hereby corrected as shown below:

On the title page, item (63), under "Related U.S. Application Data", in column 1, line 3, delete "continuation-in-part" and insert -- division --, therefor.

Signed and Sealed this
Twenty-fifth Day of March, 2014

Michelle K. Lee
*Deputy Director of the United States Patent and Trademark Office*